United States Patent
Sueyoshi et al.

(10) Patent No.: US 7,718,284 B2
(45) Date of Patent: May 18, 2010

(54) PRINTED CIRCUIT BOARD AND FUEL CELL

(75) Inventors: Taiki Sueyoshi, Ibaraki (JP); Hiroshi Yamazaki, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/104,597

(22) Filed: Apr. 17, 2008

(65) Prior Publication Data

US 2008/0261086 A1    Oct. 23, 2008

(30) Foreign Application Priority Data

Apr. 18, 2007    (JP) ............................... 2007-109310

(51) Int. Cl.
*H01M 14/00*    (2006.01)
*H01M 8/00*    (2006.01)
*H05K 1/00*    (2006.01)

(52) U.S. Cl. ........................... 429/7; 361/748; 361/749; 429/12; 429/34

(58) Field of Classification Search .................... 429/7, 429/12, 34; 361/749
See application file for complete search history.

(56) References Cited

U.S. PATENT DOCUMENTS 5,733,598 A    3/1998    Sera et al.

2004/0131907 A1    7/2004    Arita et al.

FOREIGN PATENT DOCUMENTS

| EP | 1835558 A1 | 9/2007 |
|----|------------|--------|
| EP | 1874101 A1 | 1/2008 |
| JP | 2004-200064 A | 7/2004 |
| WO | 2006112478 A1 | 4/2006 |
| WO | 2006057283 A1 | 6/2006 |

*Primary Examiner*—Jerry Lorengo
*Assistant Examiner*—Joseph V Micali
(74) *Attorney, Agent, or Firm*—Panitch Schwarze Belisario & Nadel LLP

(57) ABSTRACT

A base insulating layer of an FPC board includes a rectangular first insulating portion and a second insulating portion that outwardly extends from one side of the first insulating portion. A conductor layer is formed on one surface of the base insulating layer. The conductor layer includes a pair of rectangular collector portions and a pair of extraction conductor portions that extend in a long-sized shape from the collector portions. One collector portion is formed in a first region of the first insulating portion of the base insulating layer, and the other collector portion is formed in a second region of the first insulating portion. One extraction conductor portion extends from the one collector portion to the second insulating portion, and the other extraction conductor portion extends from the other collector portion to the second insulating portion.

6 Claims, 6 Drawing Sheets

PRINTED CIRCUIT BOARD AND FUEL CELL

BACKGROUND OF THE INVENTION

1. Field of the Invention

The present invention relates to a printed circuit board and a fuel cell using the same.

2. Description of the Background Art

Batteries that are small in size and have high capacitance are desired for mobile equipment such as cellular telephones. Therefore, fuel cells capable of providing high energy densities compared to conventional batteries such as lithium secondary batteries have been developed. Examples of the fuel cells include a direct methanol fuel cell.

In the direct methanol fuel cell, methanol is decomposed by a catalyst, forming hydrogen ions. The hydrogen ions are reacted with oxygen in the air to generate electrical power. In this case, chemical energy can be converted into electrical energy with extremely high efficiency, so that a significantly high energy density can be obtained.

A flexible printed circuit board (hereinafter abbreviated as an FPC board), for example, is provided within such a direct methanol fuel cell as a collector circuit (see JP 2004-200064 A, for example). Here, a configuration of the conventional fuel cell is described using FIG. 6. FIG. 6(a) is a plan view of the FPC board used in the conventional fuel cell, and FIG. 6(b) is a sectional view showing the configuration of the conventional fuel cell.

As shown in FIG. 6(a), a pair of conductor layers 52a, 52b is formed on one surface of the FPC board 51. In addition, extraction electrodes 53a, 53b are provided so as to extend out of the conductor layers 52a, 52b, respectively.

As shown in FIG. 6(b), a fuel cell 50 is constituted by the FPC board 51, a film electrode junction 54 and a housing 55. The film electrode junction 54 is composed of a polyelectrolyte film 54a, a fuel electrode 54b and an air electrode 54c. The fuel electrode 54b is formed on one surface of the polyelectrolyte film 54a, and the air electrode 54c is formed on the other surface of the polyelectrolyte film 54a. The housing 55 is composed of a pair of half portions 55a, 55b. The half portion 55a is provided with fuel passages 56 into which fuel (methanol) flows, and the half portion 55b is provided with air passages 57 into which air flows.

The FPC board 51 is bent with its one surface on which the conductor layers 52a, 52b are formed as an inner side. The film electrode junction 54 is sandwiched between the conductor layers 52a, 52b of the bent FPC board 51. Gaskets 58a, 58b are disposed in the periphery of the FPC board 51. Then, the half portions 55a, 55b of the housing 55 are attached so as to cover a portion, excluding the extraction electrodes 53a, 53b, of the FPC board 51 from both sides of the FPC board 51. Various types of external circuits such as electronic components are electrically connected to the extraction electrodes 53a, 53b that are exposed from the housing 55.

In this fuel cell 50, methanol is supplied to the fuel electrode 54b of the film electrode junction 54 through the fuel passages 56 of the half portion 55a. Moreover, air is supplied to the air electrode 54c of the film electrode junction 54 through the air passages 57 of the half portion 55b. In this case, methanol is decomposed into hydrogen ions and carbon dioxide by a catalyst to form electrons in the fuel electrode 54b.

The hydrogen ions decomposed from the methanol pass through the polyelectrolyte film 54a to reach the air electrode 54c, and then react with oxygen in the air supplied to the air electrode 54c on the catalyst. Thus, the electrons are consumed while water is formed in the air electrode 54c. This causes the electrons to move between the conductor layers 52a, 52b of the FPC board 51 and supplies electrical power to the external circuits.

In the conventional FPC board 51 used in the fuel cell 50, the extraction electrode 53a is formed on its one end side and the extraction electrode 53b is formed on its other end side as described above. Therefore, the extraction electrodes 53a, 53b are arranged on different surfaces in a state where the FPC board 51 is bent. In this case, complicated operation of alignment is required when the external circuits are connected to the extraction electrodes 53a, 53b. In addition, reliability of connection between the external circuits and the extraction electrodes 53a, 53b is not sufficiently ensured, and problems such as a positional shift are generated.

SUMMARY OF THE INVENTION

An object of the present invention is to provide a printed circuit board capable of improving reliability of its connection to an external circuit and a fuel cell including the same.

(1) According to an aspect of the present invention, a printed circuit board includes an insulating layer having one surface and the other surface while including first and second regions that are adjacent to each other and a third region that is adjacent to the first region on the one surface, a first conductor layer formed on the first region of the insulating layer, a second conductor layer formed on the second region of the insulating layer, a first extraction portion formed so as to extend from the first conductor layer to the third region of the insulating layer, and a second extraction portion formed so as to extend from the second conductor layer to the third region of the insulating layer, wherein a bent portion is provided at a boundary between the first region and the second region, and the third region is provided so that at least part of the first extraction portion and at least part of the second extraction portion on the third region are not overlapped with the second region when the first and second regions are bent at the bent portion with the one surface as an inner side.

In this printed circuit board, the first conductor layer is formed in the first region on the one surface of the insulating layer, and the second conductor layer is formed in the second region on the one surface of the insulating layer. In addition, the first extraction portion is formed so as to extend from the first conductor layer to the third region of the insulating layer, and the second extraction portion is formed so as to extend from the second conductor layer to the third region of the insulating layer.

When this printed circuit board is used in a fuel cell, the first extraction portion and the second extraction portion are outwardly extracted while the first and second regions of the insulating layer are bent at the bent portion with the one surface as the inner side. In this case, at least part of the first extraction portion and at least part of the second extraction portion are exposed on the same surface while the first and second extraction portions extend to the common third region. This allows the first and second extraction portions and terminals of the external circuits to be easily and accurately aligned. Thus, reliability of connection between the fuel cell using this printed circuit board and the external circuits is improved.

(2) The first and second regions of the insulating layer may each have a substantially rectangular shape with the bent portion as a common one side, and the third region may be adjacent to another one side, being substantially parallel to the bent portion, of the first region.

In this case, at least part of the first extraction portion and at least part of the second extraction portion on the third region project from another one side, being substantially parallel to the bent portion, of the second region when the first and second regions are bent at the bent portion with the one surface as the inner side. This allows the first and second extraction portions and the terminals of the external circuits to be more easily and accurately aligned.

(3) The first and second regions of the insulating layer may each have a substantially rectangular shape with the bent portion as a common one side, and the third region may be adjacent to another one side, being substantially vertical to the bent portion, of the first region.

In this case, at least part of the first extraction portion and at least part of the second extraction portion on the third region project from another one side, being substantially vertical to the bent portion, of the second region when the first and second regions are bent at the bent portion with the one surface as the inner side. This allows the first and second extraction portions and the terminals of the external circuits to be further easily and accurately aligned.

(4) The printed circuit board may further include a metal layer that has electrical conductivity and acid resistance and is formed so as to cover the first and second conductor layers and the first and second extraction portions.

In this case, corrosion caused by acid can be prevented while electrical conductivity of the first and second conductor layers and the first and second extraction portions is ensured even in a state where acid is in contact with a surface of the printed circuit board.

(5) The metal layer may include gold. In this case, corrosion caused by acid can be reliably prevented while electrical conductivity of the first and second conductor layers and the first and second extraction portions is sufficiently ensured even in the state where acid is in contact with the surface of the printed circuit board since gold has high electrical conductivity and high acid resistance.

(6) The printed circuit board may further include a cover insulating layer that covers an interface between the metal layer and the insulating layer at least on the first and second regions of the insulating layer.

In this case, acid is prevented from being in contact with the first and second conductor layers and the first and second extraction portions on the first and second regions through the interface between the metal layer and the insulating layer while electrical connection between the first and second extraction portions and the external circuits is obtained on the third region. This can more reliably prevent the first and second conductor layers and the first and second extraction portions from corroding.

(7) The printed circuit board may further include a first through hole formed so as to penetrate the first region of the insulating layer and the first conductor layer and a second through hole formed so as to penetrate the second region of the insulating layer and the second conductor layer.

In this case, fuel and air can be supplied to a fuel electrode and an air electrode of the fuel cell through the first and second through holes in the fuel cell using this printed circuit board.

(8) According to another aspect of the present invention, a fuel cell includes a printed circuit board, a cell element, and a housing that accommodates the printed circuit board and the cell element, wherein the printed circuit board includes an insulating layer having one surface and the other surface while including first and second regions that are adjacent to each other and a third region that is adjacent to the first region on the one surface, a first conductor layer formed on the first region of the insulating layer, a second conductor layer formed on the second region of the insulating layer, a first extraction portion formed so as to extend from the first conductor layer to the third region of the insulating layer, and a second extraction portion formed so as to extend from the second conductor layer to the third region of the insulating layer, a bent portion is provided at a boundary between the first region and the second region, and the third region is provided so that at least part of the first extraction portion and at least part of the second extraction portion on the third region are not overlapped with the second region when the first and second regions are bent at the bent portion with the one surface as an inner side, the cell element is arranged between the first and second regions while the first and second regions of the insulating layer of the printed circuit board are bent along the bent portion with the one surface as the inner side, and the third region of the insulating layer is outwardly extracted from the housing so that at least part of the first extraction portion and at least part of the second extraction portion are exposed to the outside of the housing.

In this fuel cell, the first and second regions of the insulating layer of the printed circuit board are bent along the bent portion with the one surface as the inner side. The fuel element is arranged between the first and second regions of the bent printed circuit board.

In the state, the printed circuit board and the cell element are accommodated in the housing. The third region of the insulating layer of the printed circuit board is drawn out of the housing so that at least part of the first extraction portion and at least part of the second extraction portion are exposed to the outside of the housing.

In this case, at least part of the first extraction portion and at least part of the second extraction portion of the printed circuit board are exposed on the same surface in the outside of the housing. This allows the first and second extraction portions and the terminals of the external circuits to be easily and accurately aligned. Thus, the reliability of connection between the fuel cell and the external circuits is improved.

According to the present invention, the first and second extraction portions of the printed circuit board and the terminals of the external circuits can be easily and accurately aligned. Accordingly, the reliability of connection between the fuel cell using this printed circuit board and the external circuits is improved.

Other features, elements, characteristics, and advantages of the present invention will become more apparent from the following description of preferred embodiments of the present invention with reference to the attached drawings.

DESCRIPTION OF THE PREFERRED EMBODIMENTS

Figure 1:
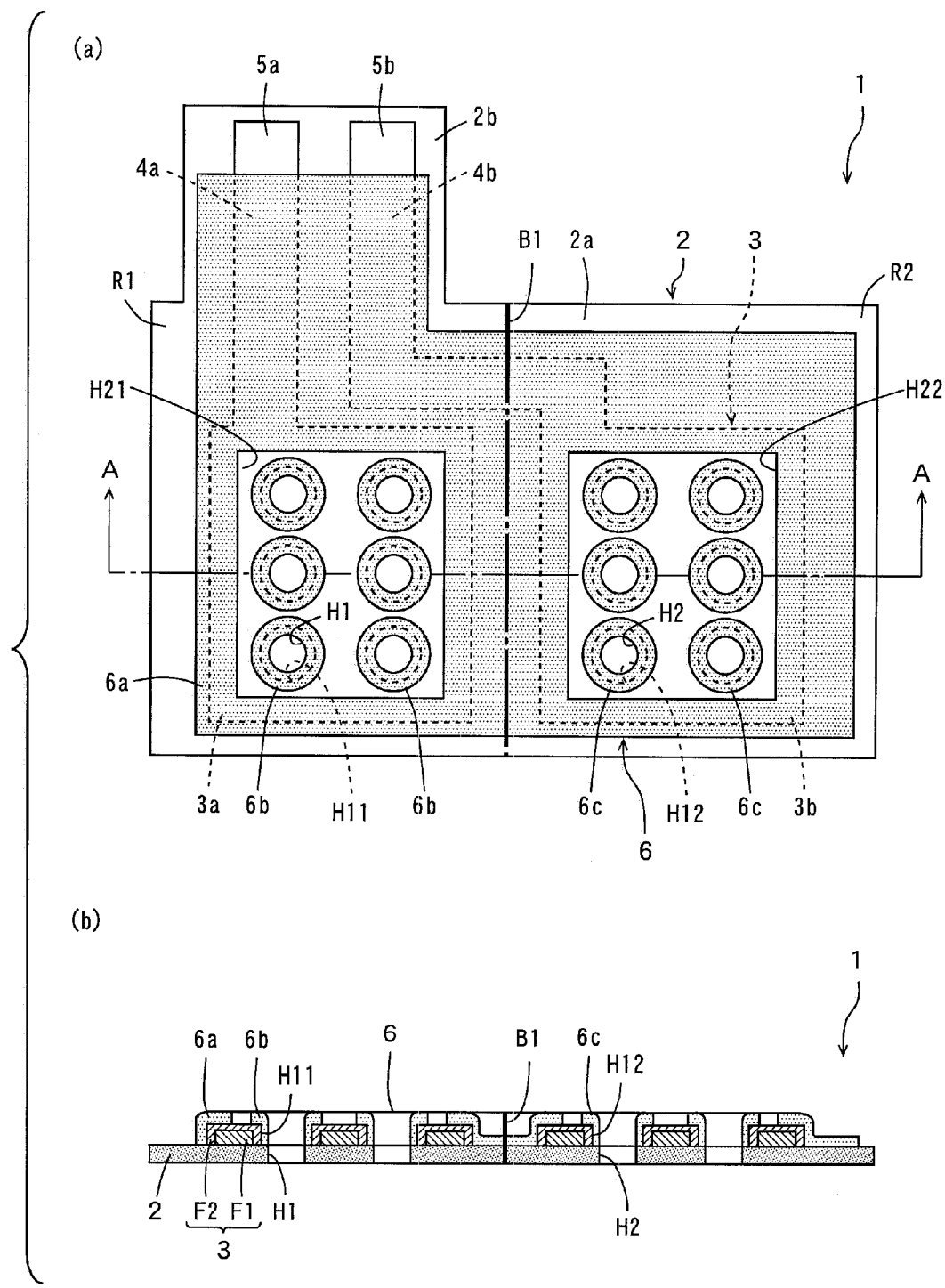
FIG. 1 is a diagram showing a configuration of a flexible printed circuit board according to the present embodiment.

A printed circuit board and a fuel cell according to an embodiment of the present invention will now be described while referring to drawings. Note that a flexible printed circuit board having flexibility is described as an example of the printed circuit board in the present embodiment.

(1) Configuration of the Flexible Printed Circuit Board

FIG. 1(a) is a plan view of the flexible printed circuit board according to the present embodiment, and FIG. 1(b) is a sectional view taken along the line A-A of the printed circuit board of FIG. 1(a). In the following description, the flexible printed circuit board is abbreviated as the FPC board.

As shown in FIG. 1(a) and FIG. 1(b), the FPC board 1 is formed of a base insulating layer 2, a conductor layer 3 and a cover insulating layer 6.

The base insulating layer 2 is made of polyimide, for example, and includes a rectangular first insulating portion 2a and a second insulating portion 2b that outwardly extends from one side of the first insulating portion 2a. Hereinafter, the above-mentioned one side of the first insulating portion 2a and the other one side parallel thereto are referred to as lateral sides, and the other pair of sides vertical to the lateral sides of the first insulating portion 2a are referred to as end sides.

A bent portion B1 is provided in the first insulating portion 2a of the base insulating layer 2 so as to be parallel to the end sides and to divide the first insulating portion 2a into two substantially equal parts. As will be described later, the first insulating portion 2a is bent along the bent portion B1. The bent portion B1 may be a shallow groove with a line shape, a mark with a line shape or the like, for example. Alternatively, there may be nothing at the bent portion B1 if the first insulating portion 2a can be bent at the bent portion B1. Hereinafter, one region of the first insulating portion 2a with the bent portion B1 as its boundary is referred to as a first region R1, and the other region is referred to as a second region R2. The above-mentioned second insulating portion 2b is formed so as to outwardly extend from the lateral side of the first region R1 of the first insulating portion 2a.

A plurality of (six in this example) circular openings H1 are formed in the first region R1 of the first insulating portion 2a. In addition, a plurality of (six in this example) circular openings H2 are formed in the second region R2 of the first insulating portion 2a.

The conductor layer 3 is formed on one surface of the base insulating layer 2. The conductor layer 3 includes a pair of rectangular collector portions 3a, 3b and extraction conductor portions 4a, 4b extending in a long-sized shape from the collector portions 3a, 3b, respectively.

Each of the collector portions 3a, 3b has a pair of lateral sides parallel to the lateral sides of the first insulating portion 2a and a pair of end sides parallel to the end sides of the first insulating portion 2a. The collector portion 3a is formed in the first region R1 of the first insulating portion 2a of the base insulating layer 2, and the collector portion 3b is formed in the second region R2 of the first insulating portion 2a.

Circular openings H11 each having a larger diameter than that of the opening H1 are formed in portions, above the openings H1 of the base insulating layer 2, of the collector portion 3a. Circular openings H12 each having a larger diameter than that of the opening H2 are formed in portions, above the openings H2 of the base insulating layer 2, of the collector portion 3b.

The extraction conductor portion 4a is formed so as to linearly extend from the lateral side of the collector portion 3a to the region on the second insulating portion 2b. The extraction conductor portion 4b is formed so as to extend from the lateral side of the collector portion 3b and bend to the region on the second insulating portion 2b.

Note that the conductor layer 3 includes a first metal layer F1 made of copper, for example, and a second metal layer F2 made of nickel and gold, for example, as shown in FIG. 1(b). The first metal layer F1 is formed on the base insulating layer 2, and the second metal layer F2 is formed so as to cover a surface of the first metal layer F1.

As shown in FIG. 1(a), the cover insulating layer 6 is formed on the base insulating layer 2 so as to cover a predetermined portion of the conductor layer 3. The cover insulating layer 6 includes a substantially rectangular collector cover 6a and a plurality of substantially annular opening covers 6b, 6c that are described in the following.

The collector cover 6a extends to spread over the first insulating portion 2a and the second insulating portion 2b of the base insulating layer 2. In this case, the conductor layer 3 excluding the tips of the extraction conductor portions 4a, 4b is covered with the collector cover 6a. Hereinafter, the exposed tips, not covered with the collector cover 6a, of the extraction conductor portions 4a, 4b are referred to as extraction electrodes 5a, 5b.

Rectangular openings H21, H22 are formed in regions, above the collector portions 3a, 3b of the conductor layer 3, of the collector cover 6a. In the opening H21, the substantially annular opening covers 6b are formed so as to cover peripheries of the openings H11 of the collector portion 3a. In the opening H22, the substantially annular opening covers 6c are formed so as to cover peripheries of the openings H12 of the collector portion 3b.

The inside diameter of the opening cover 6b is substantially equal to the inside diameter of the opening H1 of the base insulating layer 2, and the outside diameter of the opening cover 6b is larger than the inside diameter of the opening H11 of the collector portion 3a. In addition, the inside diameter of the opening cover 6c is substantially equal to the inside diameter of the opening H2 of the base insulating layer 2, and the outside diameter of the opening cover 6c is larger than the inside diameter of the opening H12 of the collector portion 3b. In this case, the opening covers 6b, 6c are in contact with the base insulating layer 2 in the openings H11, H12 of the collector portions 3a, 3b.

(2) Manufacturing Method of the FPC Board

Figure 2:
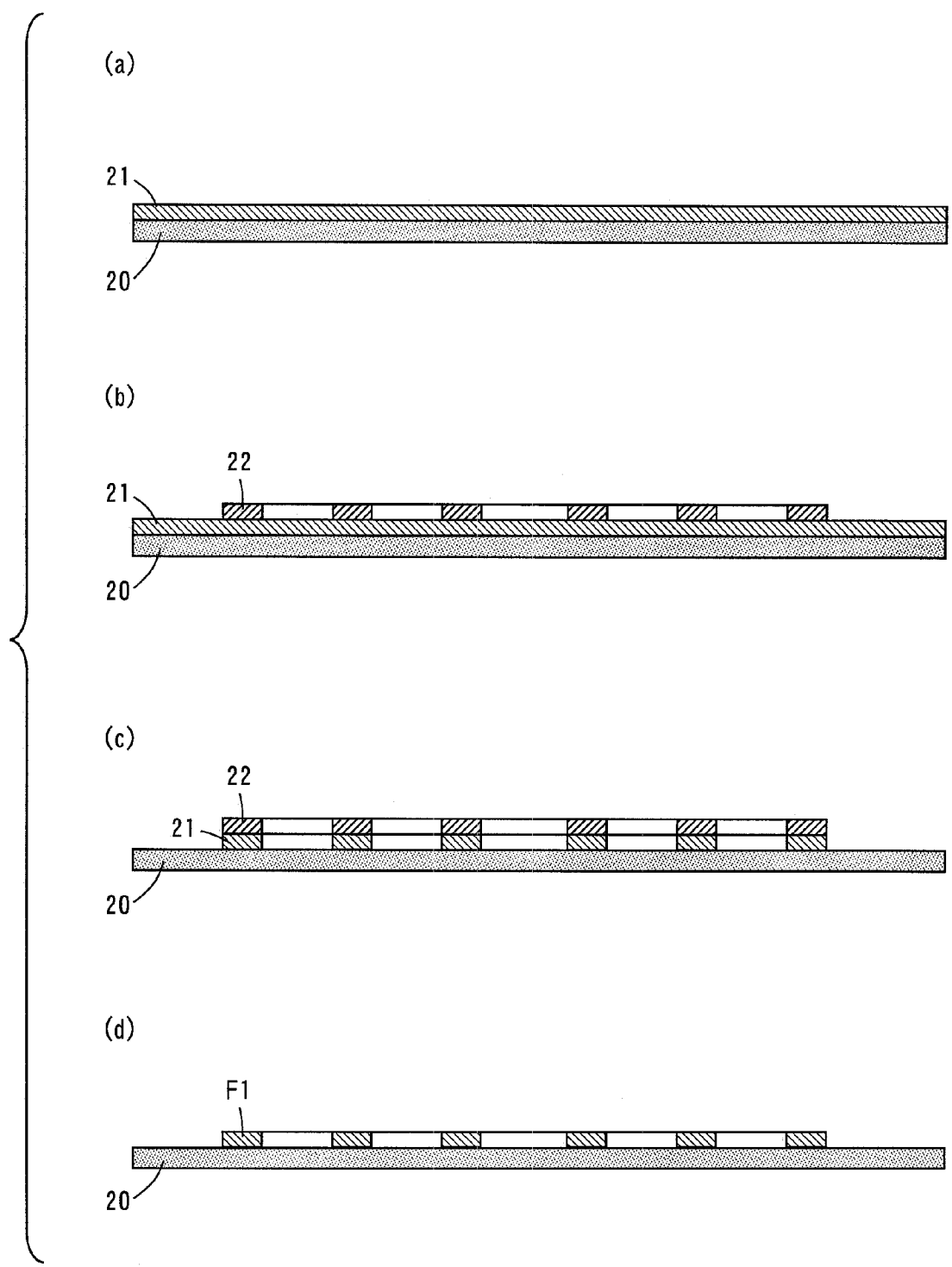
FIG. 2 is a sectional view for use in explaining steps in a manufacturing method of the flexible printed circuit board.
Figure 3:
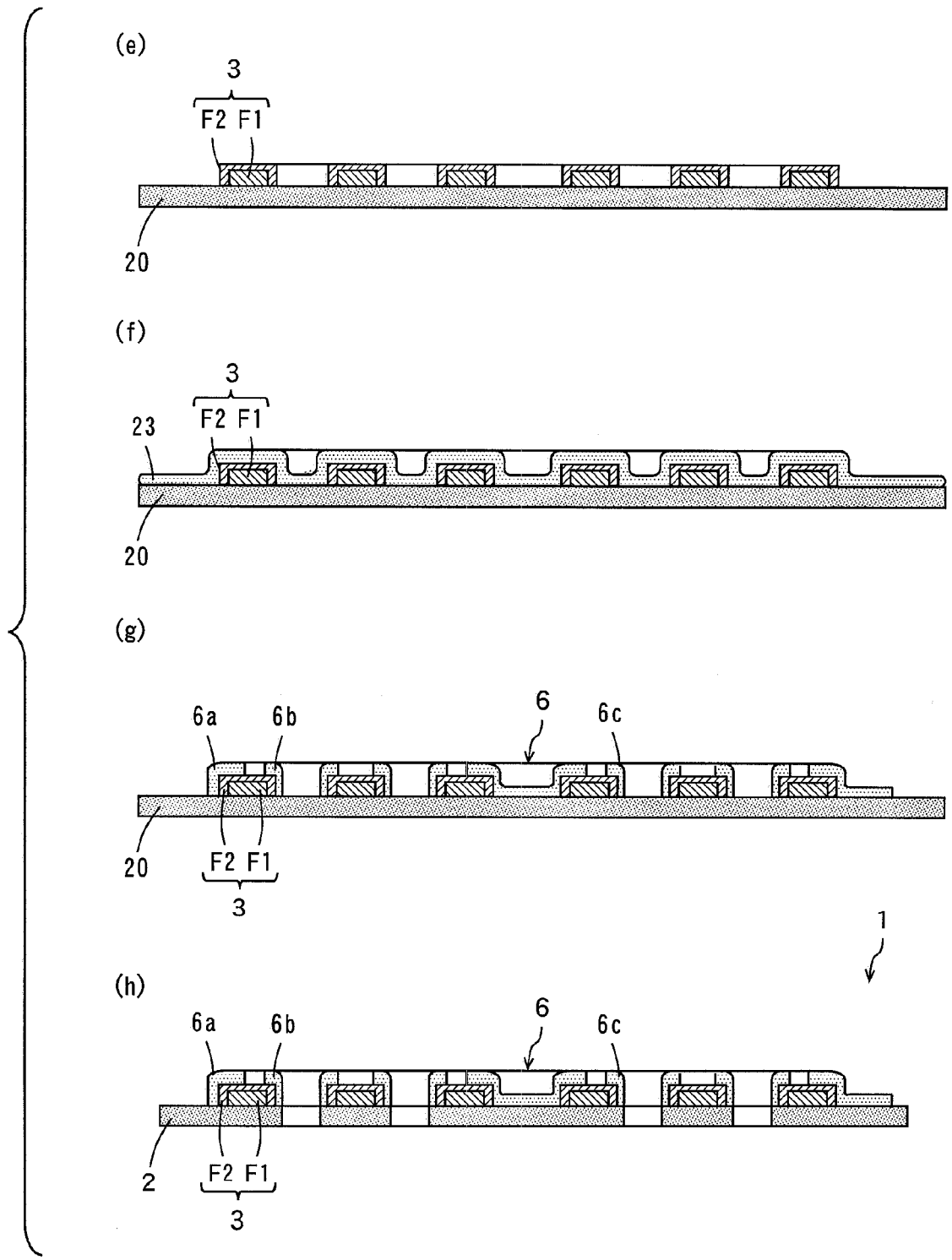
FIG. 3 is a sectional view for use in explaining steps in the manufacturing method of the flexible printed circuit board.

Next, description is made of a manufacturing method of the FPC board 1 shown in FIG. 1. FIG. 2 and FIG. 3 are sectional views for use in explaining steps in the manufacturing method of the FPC board 1.

First, a two-layer base material composed of an insulating film 20 made of polyimide, for example, and a conductor film 21 made of copper, for example, is prepared as shown in FIG. 2(a). The thickness of the insulating film 20 is 12.5 μm, for example, and the thickness of the conductor film 21 is 12 μm, for example.

Next, an etching resist 22 having a predetermined pattern is formed on the conductor film 21 as shown in FIG. 2(b). The etching resist 22 is formed by forming a resist film on the conductor film 21 using a dry film resist or the like, exposing the resist film in a predetermined pattern, and then developing the resist film, for example.

Then, a region of the conductor film 21 excluding a region below the etching resist 22 is removed by etching as shown in FIG. 2(c). The etching resist 22 is subsequently removed by a stripping liquid as shown in FIG. 2(d). In this way, a first metal layer F1 is formed on the insulating film 20.

Next, a nickel plating layer and a gold plating layer are sequentially formed on the first metal layer F1 by electrolytic plating as shown in FIG. 3(e). The thickness of the nickel plating layer is 5 μm, for example, and the thickness of the gold plating layer is 0.5 μm, for example. Accordingly, the conductor layer 3 composed of the first metal layer F1 and the second metal layer F2 is formed.

Then, a cover insulating film 23 is formed on the insulating film 20 so as to cover the conductor layer 3 as shown in FIG. 3(f). Note that the cover insulating film 23 is suitably cured by heating after the formation of the cover insulating film 23. The thickness of the cover insulating layer 23 is 12.5 μm, for example.

The cover insulating film 23 is subsequently exposed in a predetermined pattern, followed by development, so that the cover insulating layer 6 composed of the collector cover 6a and the opening covers 6b, 6c is formed as shown in FIG. 3(g).

Thereafter, the cover insulating layer 6 is cured by heating. Then, the insulating film 20 is cut into a predetermined shape, so that the FPC board 1 composed of the base insulating layer 2, the conductor layer 3 and the cover insulating layer 6 is completed as shown in FIG. 3(h).

Note that the thickness of the base insulating layer 2 is preferably 5 to 50 μm, and more preferably 12.5 to 25 μm. The thickness of the first metal layer F1 is preferably 3 to 35 μm, and more preferably 5 to 20 μm. The thickness of the second metal layer F2 is preferably 0.1 to 10 μm, and more preferably 1 to 6 μm. The thickness of the nickel plating layer of the second metal layer F2 is preferably 3 to 6 μm, and the thickness of the gold plating layer of the second metal layer F2 is preferably 0.2 to 1 μm The thickness of the cover insulating layer 6 is preferably 3 to 25 μm, and more preferably 5 to 15 μm.

Although the manufacturing method of the FPC board 1 by a subtractive method is shown in FIG. 2 and FIG. 3, another manufacturing method such as a semi-additive method may be used.

(3) The Fuel Cell Using the FPC Board

Figure 4:
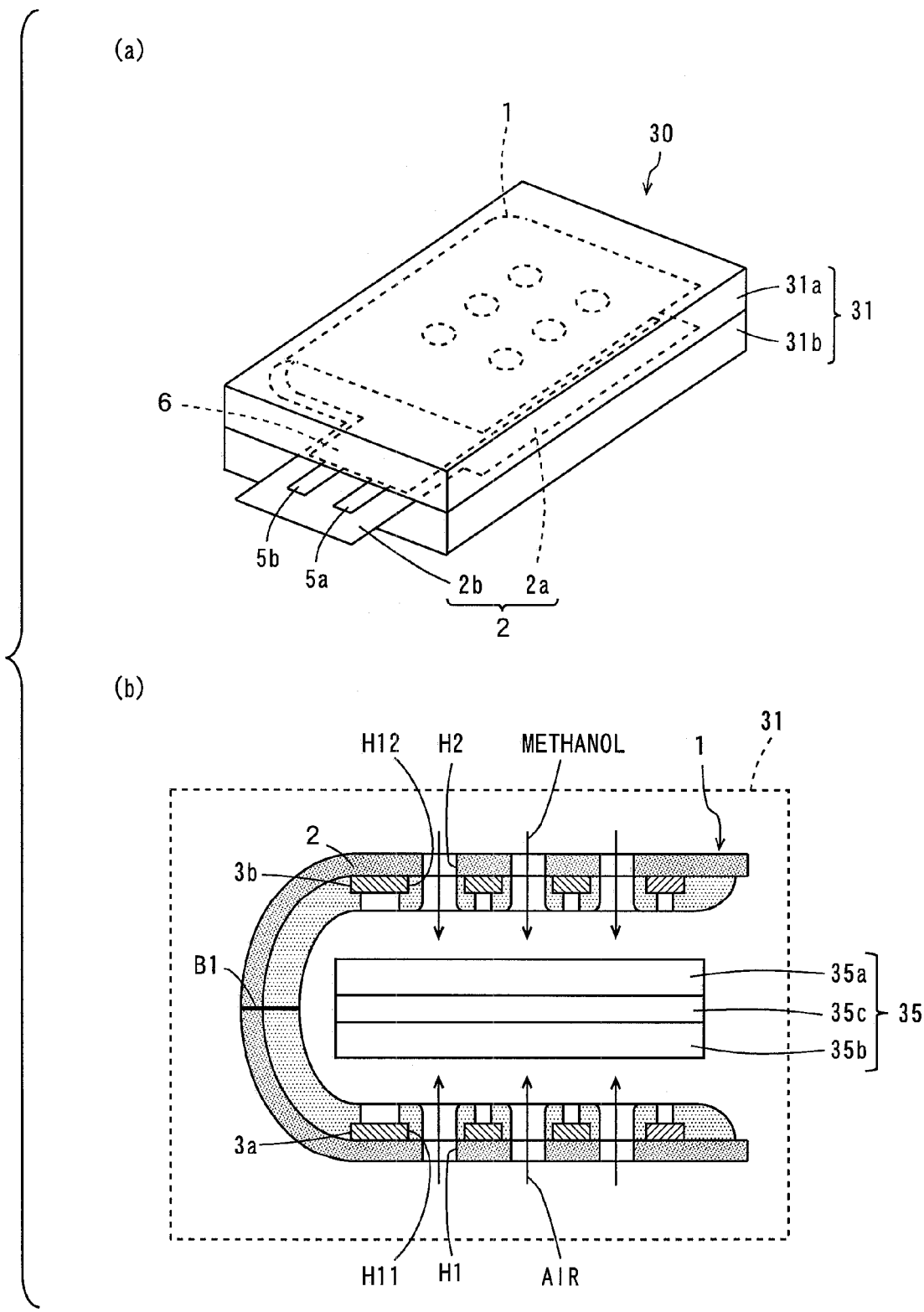
FIG. 4 is a diagram showing a configuration of a fuel cell using the flexible printed circuit board of FIG. 1.

Next, description is made of the fuel cell using the above-described FPC board 1. FIG. 4(a) is a perspective view showing the appearance of the fuel cell using the above-described FPC board 1, and FIG. 4(b) is a diagram for use in explaining functions in the fuel cell.

As shown in FIG. 4(a), the fuel cell 30 includes a rectangular parallelepiped housing 31 composed of half portions 31a, 31b. The FPC board 1 is sandwiched between the half portions 31a, 31b while being bent along the bent portion B1 of FIG. 1 with the one surface on which the conductor layer 3 (FIG. 1) and the cover insulating layer 6 are formed as its inner side.

The second insulating portion 2b of the base insulating layer 2 of the FPC board 1 is outwardly extracted from a clearance between the half portions 31a, 31b. This causes the extraction electrodes 5a, 5b on the second insulating portion 2b to be exposed to the outside of the housing 30. Terminals of various types of external circuits are electrically connected to the extraction electrodes 5a, 5b.

As shown in FIG. 4(b), an electrode film 35 is arranged between the collector portion 3a and the collector portion 3b of the bent FPC board 1 in the housing 31. The electrode film 35 is composed of a fuel electrode 35a, an air electrode 35b and an electrolyte film 35c. The fuel electrode 35a is formed on one surface of the electrolyte film 35c, and the air electrode 35b is formed on the other surface of the electrolyte film 35c. The fuel electrode 35a of the electrode film 35 faces the collector portion 3b of the FPC board 1, and the air electrode 35b faces the collector portion 3a of the FPC board 1.

Fuel is supplied to the fuel electrode 35a of the electrode film 35 through the openings H2, H12 of the FPC board 1. Note that methanol is used as fuel in the present embodiment. Air is supplied to the air electrode 35b of the electrode film 35 through the openings H1, F11 of the FPC board 1.

In this case, methanol is decomposed into hydrogen ions and carbon dioxide in the fuel electrode 35a, forming electrons. The formed electrons are led to the extraction electrode 5b (FIG. 4(a)) from the collector portion 3b of the FPC board 1. Hydrogen ions decomposed from methanol pass through the electrolyte film 35c to reach the air electrode 35b. In the air electrode 35b, hydrogen ions and oxygen are reacted while the electrons led to the collector portion 3a from the extraction electrode 5a (FIG. 4(a)) are consumed, thereby forming water. In this way, electrical power is supplied to the external circuits connected to the extraction electrodes 5a, 5b.

(4) Effects of the Present Embodiment

In the FPC board 1 of the present embodiment, the extraction electrodes 5a, 5b are formed on the common second insulating portion 2b of the base insulating layer 2. This allows the extraction electrodes 5a, 5b and the terminals of the external circuits to be easily and accurately aligned in the fuel cell 30 using the FPC board 1. Accordingly, reliability of connection between the external circuits and the fuel cell 30 is improved.

In addition, an interface between the second metal layer F2 and the base insulating layer 2 is covered with the cover insulating layer 6 while a surface of the first metal layer F1 made of copper is covered with the second metal layer F2 including the gold plating layer having high corrosion resistance in the FPC board 1 of the present embodiment. In this case, even in a state where acid of methanol or the like is in contact with a surface of the FPC board 1, the acid is reliably prevented from being in contact with the first metal layer F1 made of copper in the fuel cell 30. Accordingly, copper can be reliably prevented from corroding while inexpensive copper is used to suppress an increase in cost.

(5) Another Embodiment

Figure 5:
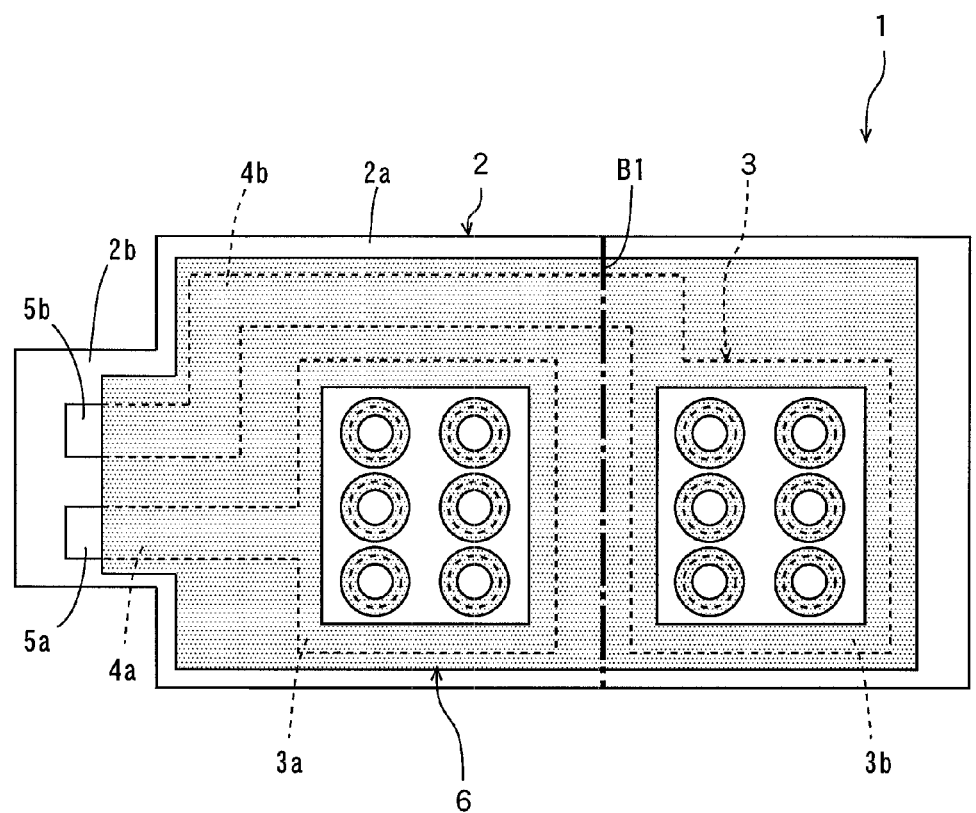
FIG. 5 is a diagram showing another example of the flexible printed circuit board.
Figure 6:
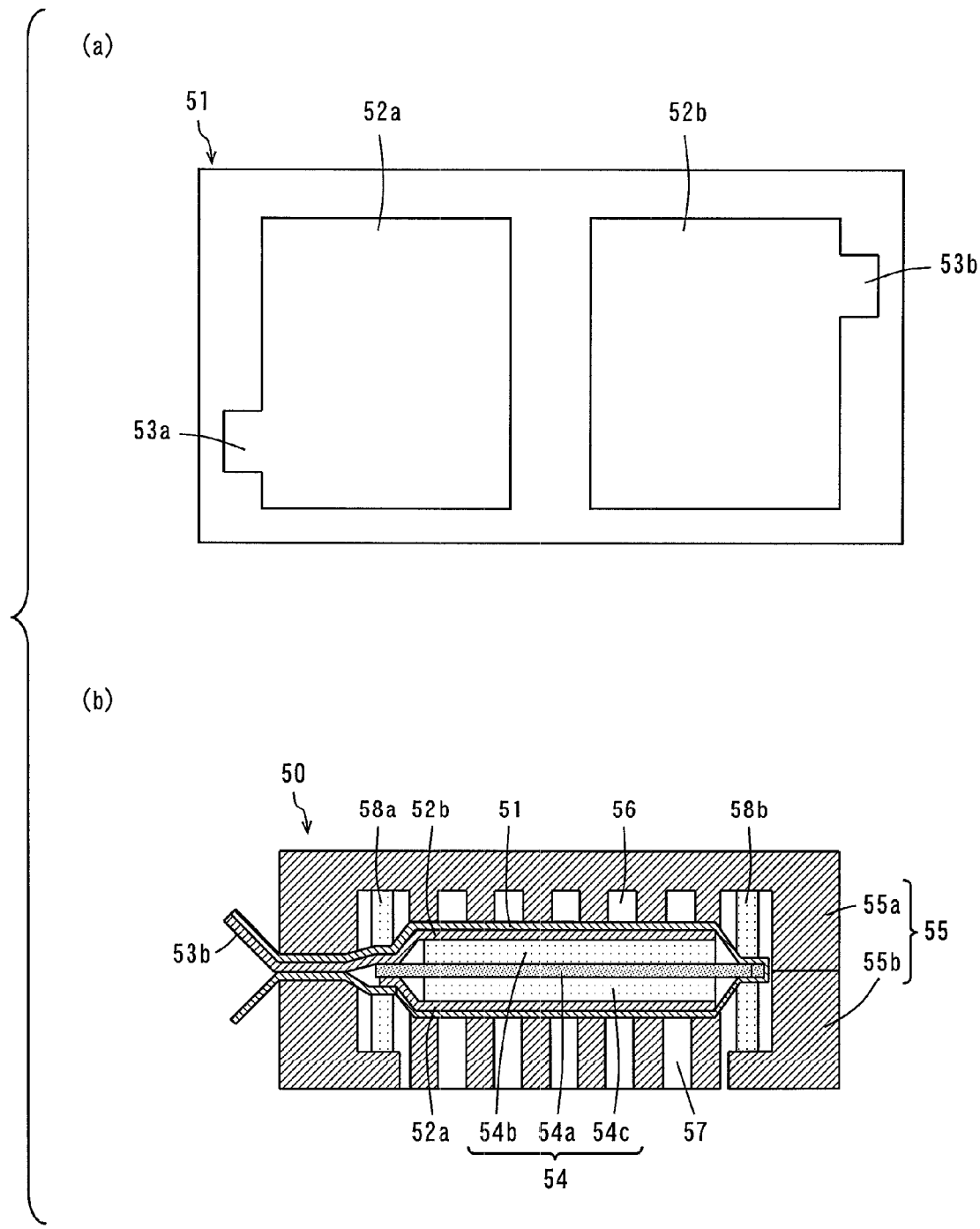
FIG. 6 is a diagram showing a fuel cell using a conventional printed circuit board.

FIG. 5 is a plan view showing another example of the FPC board 1. In the FPC board 1 of FIG. 5, the second insulating portion 2b of the base insulating layer 2 is formed so as to outwardly extend from the end side of the first insulating portion 2a. In addition, the extraction conductor portions 4a, 4b of the conductor layer 3 are formed so as to extend from the collector portions 3a, 3b to the region on the second insulating portion 2b of the base insulating layer 2. The extraction electrodes 5a, 5b are provided on this second insulating portion 2b.

Also in the fuel cell 30 using the FPC board 1 shown in FIG. 5, the external circuits can be easily and reliably attached to the extraction electrodes 5a, 5b.

Note that a material for the base insulating layer 2 and the cover insulating layer 6 is not limited to polyimide. For example, other insulating materials such as polyethylene terephthalate, polyethernitrile and polyethersulphone may be used.

In addition, a material for the first metal layer F1 of the conductor layer 3 is not limited to copper. For example, other metal materials such as copper alloy, gold and aluminum may be used. A material for the second metal layer F2 is not limited to nickel and gold. For example, other metal materials having high corrosion resistance may be used. Moreover, the first metal layer F1 and the second metal layer F2 may be formed of the same material.

The shape and size of the collector portions 3a, 3b of the conductor layer 3 can be suitably set depending on the shape and size of the base insulating layer 2.

(6) Correspondences Between Elements in the Claims and Parts in Embodiments

In the following paragraph, non-limiting examples of correspondences between various elements recited in the claims below and those described above with respect to various embodiments of the present invention are explained.

In the above-described embodiment, the base insulating layer 2 is an example of an insulating layer, the first region R1 is an example of a first region, the second region R2 is an example of a second region, the second insulating portion 2b is an example of a third region, the collector portion 3a is an example of a first conductor layer, the collector portion 3b is an example of a second conductor layer, the extraction conductor portion 4a is an example of a first extraction portion, the extraction conductor portion 4b is an example of a second extraction portion, the second metal layer F2 is an example of a metal layer, the opening H1 is an example of a first through hole, and the opening H2 is an example of a second through hole. The fuel electrode 35a, the air electrode 35b and the electrolyte film 35c are examples of a cell element.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board comprising:
    an insulating layer having one surface and the other surface while including first and second regions that are adjacent to each other and a third region that is adjacent to said first region on said one surface;
    a first conductor layer formed on said first region of said insulating layer;
    a second conductor layer formed on said second region of said insulating layer;
    a first extraction portion formed so as to extend from said first conductor layer to said third region of said insulating layer;
    a second extraction portion formed so as to extend from said second conductor layer to said third region of said insulating layer;
    a metal layer that has electrical conductivity and acid resistance and is formed on said first and second conductor layers and said first and second extraction portions; and
    a cover insulating layer formed on the insulating layer that covers an interface between said metal layer and said insulating layer at least on said first and second regions of said insulating layer,
    wherein a bent portion is provided at a boundary between said first region and said second region, and said third region is provided so that at least part of said first extraction portion and at least part of said second extraction portion on said third region are not overlapped with said second region when said first and second regions are bent at said bent portion with said one surface as an inner side.

2. The printed circuit board according to claim 1, wherein said first and second regions of said insulating layer each have a substantially rectangular shape with said bent portion as a common one side, and
    said third region is adjacent to another one side, being substantially parallel to said bent portion, of said first region.

3. The printed circuit board according to claim 1, wherein said first and second regions of said insulating layer each have a substantially rectangular shape with said bent portion as a common one side, and
    said third region is adjacent to another one side, being substantially vertical to said bent portion, of said first region.

4. The printed circuit board according to claim 1, wherein said metal layer includes gold.

5. The printed circuit board according to claim 1, further comprising
    a first through hole formed so as to penetrate said first region of said insulating layer and said first conductor layer and
    a second through hole formed so as to penetrate said second region of said insulating layer and said second conductor layer.

6. A fuel cell comprising:
    a printed circuit board;
    a cell element; and
    a housing that accommodates said printed circuit board and said cell element, wherein said printed circuit board includes
        an insulating layer having one surface and the other surface while including first and second regions that are adjacent to each other and a third region that is adjacent to said first region on said one surface;
        a first conductor layer formed on said first region of said insulating layer;
        a second conductor layer formed on said second region of said insulating layer;
        a first extraction portion formed so as to extend from said first conductor layer to said third region of said insulating layer; and
        a second extraction portion formed so as to extend from said second conductor layer to said third region of said insulating layer,
        a metal layer that has electrical conductivity and acid resistance and is formed on said first and second conductor layers and said first and second extraction portions;
        a cover insulating layer formed on the insulating layer that covers an interface between said metal layer and said insulating layer at least on said first and second regions of said insulating layer;
        a bent portion is provided at a boundary between said first region and said second region, and said third region is provided so that at least part of said first extraction portion and at least part of said second extraction portion on said third region are not overlapped with said second region when said first and second regions are bent at said bent portion with said one surface as an inner side,
    said cell element is arranged between said first and second regions while said first and second regions of said insulating layer of said printed circuit board are bent along said bent portion with said one surface as the inner side, and
    said third region of said insulating layer is outwardly extracted from said housing so that at least part of said first extraction portion and at least part of said second extraction portion are exposed to the outside of said housing.

* * * * *